(12) United States Patent
Yamamoto et al.

(10) Patent No.: US 8,976,596 B1
(45) Date of Patent: Mar. 10, 2015

(54) CONTROLLER

(71) Applicant: Kabushiki Kaisha Toshiba, Minato-ku (JP)

(72) Inventors: Kensuke Yamamoto, Yokohama (JP); Hiroshi Deguchi, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/087,469

(22) Filed: Nov. 22, 2013

Related U.S. Application Data

(60) Provisional application No. 61/869,370, filed on Aug. 23, 2013.

(51) Int. Cl.
*G11C 11/34* (2006.01)
*G11C 16/06* (2006.01)

(52) U.S. Cl.
CPC ...................... *G11C 16/06* (2013.01)
USPC ................. 365/185.18; 365/185.24

(58) Field of Classification Search
CPC ........................ G11C 16/0483; G11C 16/10
USPC ........................ 365/185.18, 185.24
See application file for complete search history.

(56) References Cited

U.S. PATENT DOCUMENTS

| 5,740,123 | A | 4/1998 | Uchida | |
|---|---|---|---|---|
| 6,715,096 | B2 | 3/2004 | Kuge | |
| 7,161,854 | B2 * | 1/2007 | Iwasaki | 365/193 |
| 8,446,196 | B2 | 5/2013 | Watanabe | |
| 8,688,399 | B2 * | 4/2014 | Best | 702/106 |
| 8,743,635 | B2 * | 6/2014 | Kizer et al. | 365/193 |

FOREIGN PATENT DOCUMENTS

| JP | 10-69769 | 3/1998 |
|---|---|---|
| JP | 2000-173273 | 6/2000 |
| JP | 2002-82830 | 3/2002 |
| JP | 2008-71018 | 3/2008 |
| JP | 2011-44795 | 3/2011 |

* cited by examiner

*Primary Examiner* — Michael Tran
(74) *Attorney, Agent, or Firm* — Oblon, McClelland, Maier & Neustadt, L.L.P.

(57) ABSTRACT

According to one embodiment, CONTROLLER includes a phase comparator that receives a data strobe signal outputted from a memory in response to a read enable signal, and a delayed data strobe signal formed by applying a delay to the data strobe signal, and outputs a result of comparison between phases of two signals. The controller also includes a Duty control unit that corrects a Duty of the read enable signal outputted to the memory based upon the comparison result of the phase comparator.

20 Claims, 7 Drawing Sheets

<BEFORE Duty CORRECTION>

<AFTER Duty CORRECTION>

<BEFORE Duty CORRECTION>

<AFTER Duty CORRECTION>

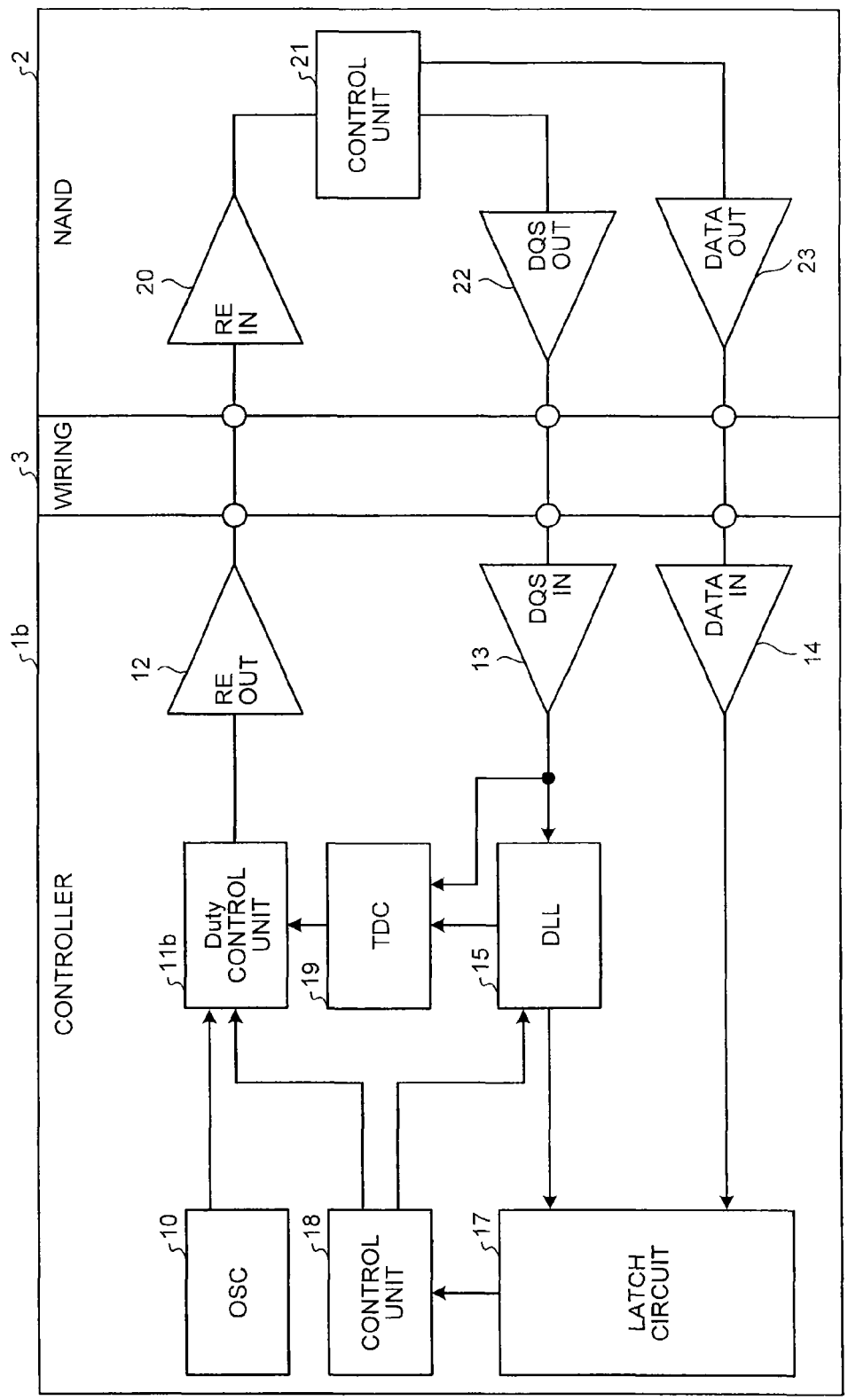

CONTROLLER

CROSS-REFERENCE TO RELATED APPLICATIONS

This application is based upon and claims the benefit of priority from U.S. Provisional Application No. 61/869,370, filed on Aug. 23, 2013; the entire contents of which are incorporated herein by reference.

FIELD

Embodiments described herein relate generally to a controller.

BACKGROUND

When a controller connected to NAND flash memory (hereinafter referred to as NAND) outputs a read enable signal to the NAND, the NAND inputs to the controller a data signal and a data strobe signal, which are in synchronism with the read enable signal. The controller latches the data signal by using a read clock signal formed by delaying the data strobe signal. With increase in speed of an interface of the NAND, the compression ratio of the data strobe signal to Valid Window becomes high due to the influence of the duty variation of the read enable signal in the controller. The Valid Window affects a set-up time and hold time upon latching data by the controller. Therefore, the controller performs control for allowing the Valid Window to secure a proper range.

BRIEF DESCRIPTION OF THE DRAWINGS

FIG. 7 is a diagram showing an example of a configuration of a storage device including a controller according to a fifth embodiment.

DETAILED DESCRIPTION

In general, according to one embodiment, CONTROLLER includes a phase comparator that receives a data strobe signal outputted from a memory in response to a read enable signal, and a delayed data strobe signal formed by applying a delay to the data strobe signal, and outputs a result of comparison between phases of two signals. The controller also includes a Duty control unit that corrects a Duty of the read enable signal outputted to the memory based upon the comparison result of the phase comparator.

Exemplary embodiments of CONTROLLER will be explained below in detail with reference to the accompanying drawings. The present invention is not limited to the following embodiments.

First Embodiment

Figure 1:
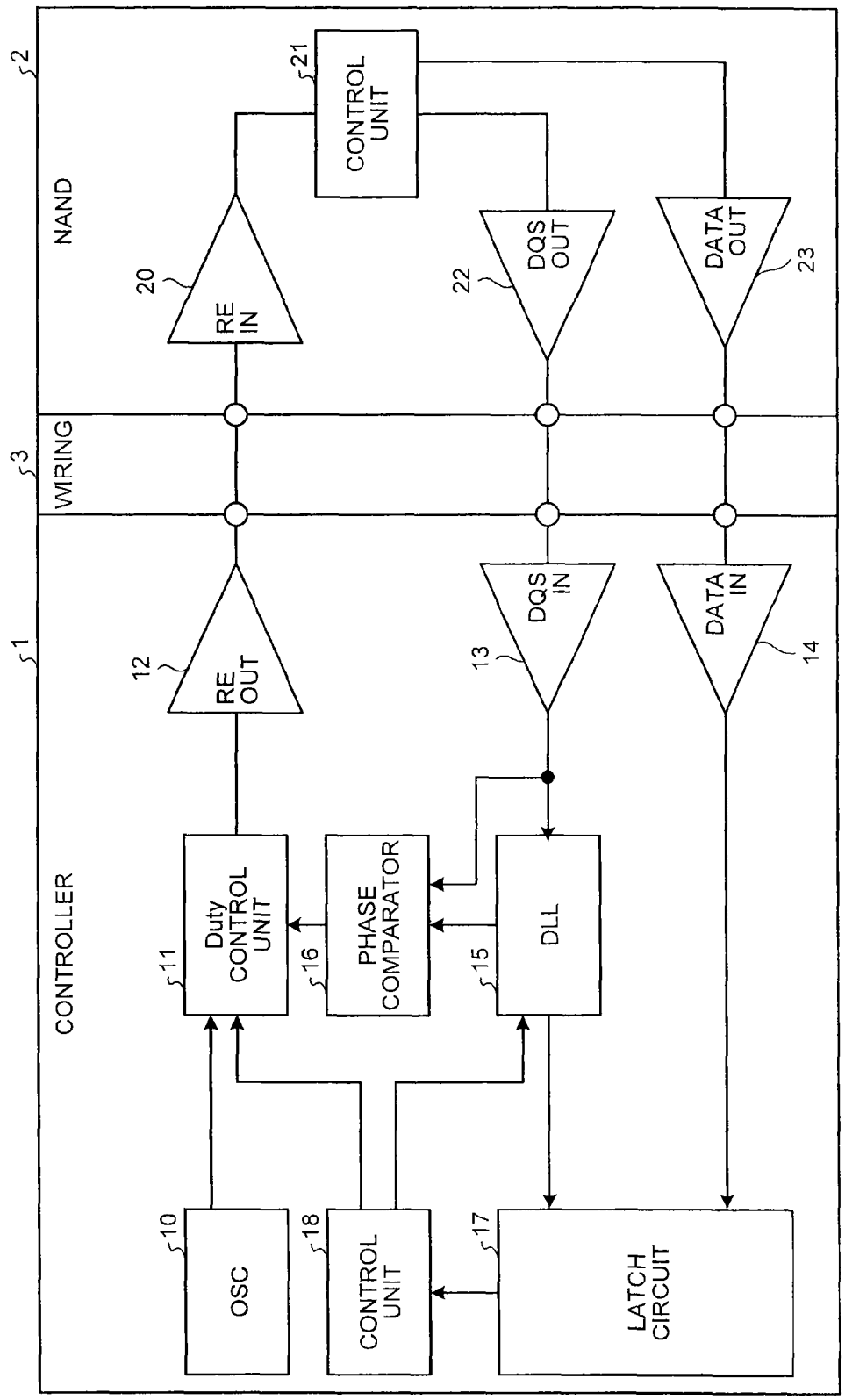
FIG. 1 is a diagram showing an example of a configuration of a storage device including a controller according to a first embodiment.

FIG. 1 is a diagram illustrating an example of a configuration of a storage device including a controller according to the present embodiment. The storage device includes a controller 1 that reads data from NAND 2, the NAND 2 that outputs data to the controller 1, and a wiring 3 that connects the controller 1 and the NAND 2. In the storage device illustrated in FIG. 1, the controller 1 outputs a read enable (hereinafter referred to as RE) signal to the NAND 2 via the wiring 3. When receiving the RE signal from the controller 1, the NAND 2 outputs a data (hereinafter referred to as DATA) signal and a data strobe (hereinafter referred to as DQS) signal to the controller 1 via the wiring 3 in response to the RE signal.

The configuration of the controller 1 will next be described. The controller 1 includes an OSC (oscillator) 10 that generates a clock signal, a Duty control unit 11 that corrects a Duty of the clock signal inputted from the OSC 10, an output buffer 12 that outputs the clock signal inputted from the Duty control unit 11 to the NAND 2 as the RE signal, an input buffer 13 that receives the DQS signal from the NAND 2, an input buffer 14 that receives the DATA signal from the NAND 2, a delay unit (hereinafter referred to as DLL (Delay Lock Loop)) 15 that applies a delay to the DQS signal from the input buffer 13, a phase comparator 16 that receives the DQS signal from the input buffer 13 and the delayed DQS signal from the DLL 15, and outputs a result of the comparison between the phases of two signals to the Duty control unit 11, a latch circuit 17 that latches the DATA signal from the input buffer 14 by using the delayed DQS signal from the DLL 15 as a read clock signal, and a control unit 18 that controls a changeover of a delay amount in the DLL 15.

The configuration of the NAND 2 will next be described. The NAND 2 includes an input buffer 20 that receives the RE signal from the controller 1, a control unit 21 that reads data from an unillustrated memory area based upon the RE signal from the input buffer 20, and outputs the DATA signal that is the read data and the DQS signal that is in synchronism with the DATA signal, an output buffer 22 that outputs the DOS signal inputted from the control unit 21 to the controller 1, and an output buffer 23 that outputs the DATA signal inputted from the control unit 21 to the controller 1. The configuration of the NAND 2 is the same as the conventional one.

Subsequently, an operation of correcting the Duty of the RE signal in the controller 1 will be described.

Upon the start of the storage device illustrated in FIG. 1, the Duty control unit 11 in the controller 1 outputs the Duty of the clock signal, which is generated by the OSC 10, to the output buffer 12 without correcting the Duty. The output buffer 12 outputs the clock signal inputted from the Duty control unit 11 to the NAND 2 via the wiring 3 as the RE signal.

When the input buffer 20 in the NAND 2 receives the RE signal from the controller 1 via the wiring 3, the control unit 21 in the NAND 2 reads data from the unillustrated memory area, and generates the DQS signal and the DATA signal in synchronism with the RE signal. The output buffer 22 outputs the DQS signal to the controller 1 via the wiring 3. The output buffer 23 outputs the DATA signal to the controller 1 via the wiring 3.

When the input buffer 13 in the controller 1 receives the DQS signal from the NAND 2 via the wiring 3, it outputs the DQS signal to the DLL 15. When the input buffer 14 receives the DATA signal from the NAND 2 via the wiring 3, it outputs the DATA signal to the latch circuit 17. The DLL 15 applies a delay of 90° to the DQS signal, and outputs the delayed DQS signal to the latch circuit 17 as the read clock signal. The latch circuit 17 latches the DATA signal from the input buffer 14 by using the read clock signal from the DLL 15.

The signal (hereinafter referred to as RE OUT input) inputted from the Duty control unit 11 to the output buffer 12 in the controller 1, the RE signal (hereinafter referred to as RE IN input) inputted to the NAND 2, the DQS signal (hereinafter referred to as DQS OUT output) outputted from the NAND 2, and the DQS signal (hereinafter referred to as DQS IN output) inputted to the controller 1 and outputted from the input buffer 13 are synchronized with one another, and it is desirable that the Duties of these signals are the same, i.e., the Duty of each signal is 50%. However, the Duty of each signal tends to shift in one direction due to the influence such as the property of the semiconductor including a transistor actually forming the controller 1 and the NAND 2, or the interference component in designing a substrate on the wiring 3.

For example, when the Duty of the RE OUT input is 50%, the Duty of the RE IN input might become larger than 50%, and the Duty of the DQS OUT output and the Duty of the DQS IN output might be much larger.

On the contrary, when the Duty of the RE OUT input is 50%, the Duty of the RE IN input might become smaller than 50%, and the Duty of the DQS OUT output and the Duty of the DQS IN output might be much smaller.

In either case, the Duty of the DQS IN output might assume a value greatly different from 50% of the Duty of the RE OUT input. The DQS IN output is the basic signal of the read clock signal. Therefore, when the Duty of the DQS IN output is greatly different from 50%, the controller 1 is likely to be unable to correctly latch in the latch circuit 17.

Therefore, the controller 1 controls the Duty of the RE OUT input such that the Duty of the DQS IN output, which is greatly different from the Duty of the RE OUT input, becomes 50%.

Specifically, in the controller 1, the DLL 15 outputs the DQS signal, which has a delay of 180° from the DQS signal, to the phase comparator 16. In this case, the delay amount in the DLL 15 is different from the delay amount of the signal outputted to the latch circuit 17. Therefore, the control unit 18 controls the changeover of the delay amount in the DLL 15. The phase comparator 16 compares the phase of the DQS signal (the DQS IN output) from the input buffer 13 and the phase of the delayed DQS signal (the DQS IN output) from the DLL 15.

The reason why the delay of 180° is applied to the DQS signal from the input buffer 13 (the DQS IN output) as the delayed DQS signal (DQS IN output) will be described below. Since the DQS signal before the delay and the delayed DQS signal (the DQS IN output) have the same Duty, the relationship between the Hi period and the Low period during one cycle of each signal is not changed. For example, when one cycle of the DQS signal (the DQS IN output) is 360°, i.e., when the period from the rising to the next rising of the DQS signal (the DQS IN output) is 360°, in the case where the Duty of the DQS signal (the DQS IN output) is 50%, the period when the signal is Hi and the period when the signal is Low are the same, specifically, each period can be represented as 180° (=360°/2). In this case, the falling phase (the timing when the signal changes to Low from Hi) of the DQS signal before the delay (the DQS IN output) and the rising phase (the timing when the signal changes to Hi from Low) of the delayed DQS signal (the DQS IN output) to which the delay of 180°, which is a half of one cycle from the rising to the next rising of the DQS signal (the DQS IN output), is applied are the same. The rising phase of the DQS signal before the delay (the DQS IN output) and the falling phase of the DQS signal with the delay of 180° (the DQS IN output) are also the same. As described above, when the Hi period and the Low period of the signal are the same, i.e., the Duty of the signal is 50% in the DQS signal before the delay (the DQS IN output) and the DQS signal with the delay of 180° (the DQS IN output), the falling phase of one of the signals agrees with the rising phase of the other one. On the other hand, when the Hi period and the Low period of the signal are different from each other, i.e., the Duty of the signal is not 50% in the DQS signal before the delay (the DQS IN output) and the DQS signal with the delay of 180° (the DQS IN output), the falling phase of one of the signals does not agree with the rising phase of the other one.

The Duty condition of the DQS signal (the DQS IN output) can be determined by comparing the falling phase of one of the DQS signal before the delay (the DQS IN output) and the DOS signal with the delay of 180° (the DQS IN output) and the rising phase of the other one.

The DLL 15 preliminarily counts the time for 360° of the DQS IN output as the number of stage of the delay circuit, and outputs the signal to which a half of the number of stage is applied as the signal with the delay of 180°. Thus, the DLL 15 can output a signal (here, the signal with the delay of 180°) on an ideal timing, regardless of the duty ratio.

A method of determining whether the Duty is larger than or smaller than 50% by comparing the falling phase of one of the DQS signal before the delay (the DQS IN output) and the DQS signal with the delay of 180° (the DQS IN output) and the rising phase of the other one will be specifically described.

Figure 2:
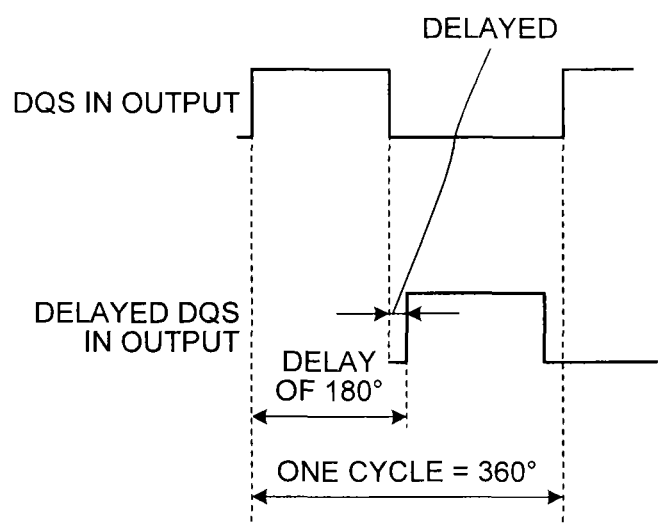
FIG. 2 is a view showing an example of comparison between phases of two signals on a phase comparator, when a Duty of a DQS signal is smaller than an RE signal.

FIG. 2 is a view illustrating an example of comparison between phases of two signals on the phase comparator, when the Duty of the DQS signal is smaller than the RE signal. In FIG. 2, one cycle of the DQS IN output and the delayed DQS IN output is 360°, and the delayed DOS IN output is delayed by 180° with the rising of the DQS IN output being used as a reference. For example, when the Duty of the DQS IN output inputted to the input buffer 13 is smaller than 50%, the Hi period is shorter than the Low period in one cycle of the signal, so that the Hi period of the signal is smaller than 180°. In this case, the rising point of the delayed DQS IN output with the delay of 180° is after the falling point of the DQS IN output before the delay, this DQS IN output having the Hi period smaller than 180°. In other words, the DQS IN output before the delay is already in Low condition on the rising point of the delayed DQS IN output. Specifically, the rising of the delayed DQS IN output with the delay of 180° is delayed from the falling of the DQS IN output before the delay.

The phase comparator 16 compares the falling phase of the DQS IN output from the input buffer 13 and the rising phase of the delayed DQS IN output from the DLL 15, and determines that the rising phase of the delayed DQS IN output from the DLL 15 is delayed. In this case, the phase comparator 16 outputs information indicating the phase delay to the Duty control unit 11. The information is outputted such that, when the phase is delayed, "0" is outputted, and when the phase advances, "1" of 1-bit signal is outputted. However, the output method is not limited thereto.

It can be considered that the phase comparator 16 compares the falling phase of the DQS IN output from the input buffer 13 and the rising phase of the delayed DQS IN output from the DLL 15, and can determine that the Duty is both 50% in which the Hi period and the Low period in each signal are the same, when the phases agree with each other. However, in this embodiment, the case where the phases exactly agree with each other is not assumed, and two cases, which are the case where the phase delay occurs and the case where the phase lead occurs, are assumed.

In FIG. 2, the phase comparator 16 outputs the signal of "0" indicating the phase delay to the Duty control unit 11.

When receiving "0" of the 1-bit signal, which indicates that the rising phase of the delayed DQS IN output is delayed, from the phase comparator 16, the Duty control unit 11 determines that the Duty of the DQS IN output is smaller than 50%. Therefore, the Duty control unit 11 corrects the clock signal from the OSC 10 to increase the Duty to be larger than the current Duty, and outputs the clock signal whose Duty is corrected to the output buffer 12. The succeeding operations of the controller 1 and the NAND 2 are as stated previously. The phase comparator 16 repeatedly makes the comparison for the DQS signal (DQS IN output) outputted from the NAND 2 in synchronism with the RE signal whose Duty is corrected.

As described above, the phase comparator 16 outputs the information indicating the phase delay or the phase lead to the Duty control unit 11. However, the phase comparator 16 cannot output information indicating how much is the delay or how much is the lead. Therefore, the phase comparator 16 repeatedly makes comparison of phases, and outputs the comparison result to the Duty control unit 11. Accordingly, the controller 1 controls to gradually make the Duty of the DQS IN output close to 50%.

Figure 3A:
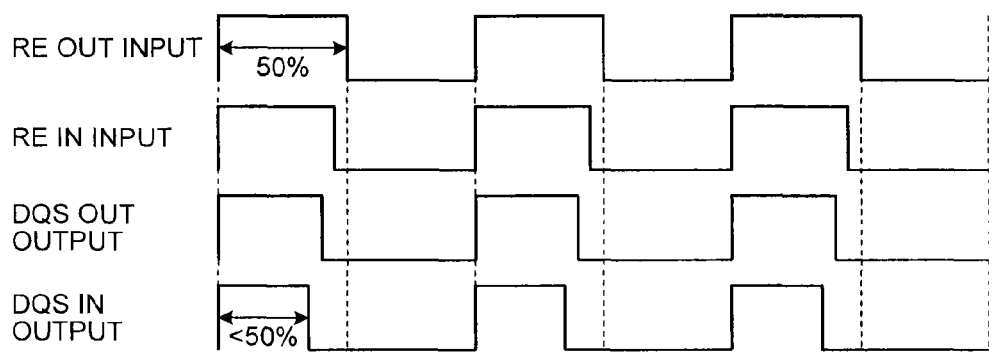
FIG. 3A is a view showing a Duty condition of each signal before a Duty correction in the case where the Duty of the DQS signal is smaller than the RE signal.
Figure 3B:
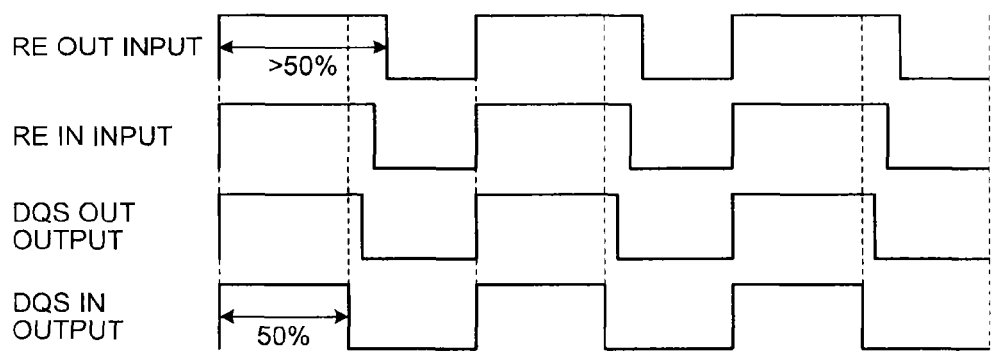
FIG. 3B is a view showing a Duty condition of each signal after the Duty correction in the case where the Duty of the DQS signal is smaller than the RE signal.

FIG. 3A is a view illustrating the Duty condition of each signal before the Duty correction in the case where the Duty of the DQS signal is smaller than the RE signal. FIG. 3B is a view illustrating the Duty condition of each signal after the Duty correction in the case where the Duty of the DQS signal is smaller than the RE signal. When the Duty of the RE OUT input is 50%, the Duty becomes smaller in the order of the RE IN input, the DQS OUT output, and the DQS IN output, before the Duty correction. Therefore, the Duty control unit 11 makes correction to increase the Duty of the RE OUT input to be larger than 50% in order that the Duty of the DQS IN output becomes 50%, when the Duty becomes smaller in the order of the RE IN input, the DQS OUT output, and the DQS IN output. When the Duty of the RE OUT input increases beforehand in this way, the Duty of 50% of the DQS IN output can be secured after the Duty correction.

The case where the phase lead occurs, i.e., the Duty of the DQS signal is larger than the RE signal, as a result of the phase comparison by the phase comparator 16, will next be described.

Figure 4:
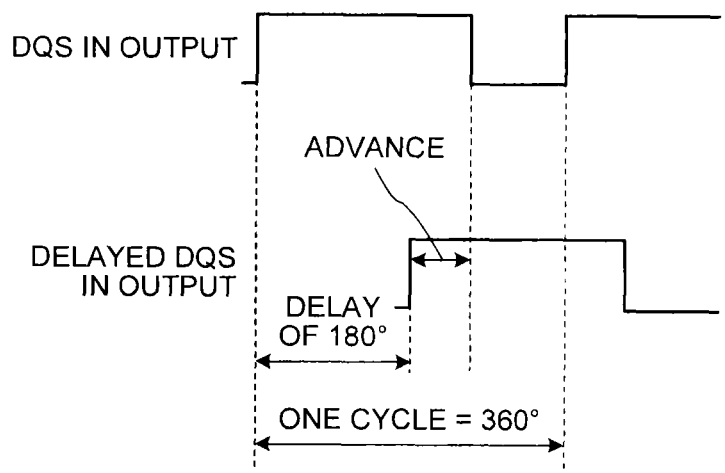
FIG. 4 is a view showing an example of comparison between phases of two signals on the phase comparator, when the Duty of the DQS signal is larger than the RE signal.

FIG. 4 is a view illustrating an example of comparison between phases of two signals on the phase comparator, when the Duty of the DQS signal is larger than the RE signal. In FIG. 4, one cycle of the DQS IN output and the delayed DQS IN output is 360°, and the delayed DQS IN output is delayed by 180° with the rising of the DQS IN output being used as a reference. For example, when the Duty of the DQS IN output inputted to the input buffer 13 is larger than 50%, the Hi period is longer than the Low period in one cycle of the signal, so that the Hi period of the signal is larger than 180°. In this case, the rising point of the delayed DQS IN output with 180° delay is before the falling point of the DQS IN output before the delay, this DQS IN output having the Hi period larger than 180°. In other words, the DQS IN output before the delay is still in Hi condition on the rising point of the delayed DQS IN output. Specifically, the rising of the delayed DQS IN output with the delay of 180° advances from the falling of the DOS IN output before the delay.

The phase comparator 16 compares the falling phase of the DQS IN output from the input buffer 13 and the rising phase of the delayed DQS IN output from the DLL 15, and determines that the rising phase of the delayed DQS IN output from the DLL 15 advances. In this case, the phase comparator 16 outputs "1" of 1-bit information indicating the phase lead to the Duty control unit 11.

When receiving "1" of the 1-bit signal, which indicates that the rising phase of the delayed DQS IN output advances, from the phase comparator 16, the Duty control unit 11 determines that the Duty of the DQS IN output is larger than 50%. Therefore, the Duty control unit 11 corrects the clock signal from the OSC 10 to decrease the Duty to be smaller than the current Duty, and outputs the clock signal whose Duty is corrected to the output buffer 12. The succeeding operations of the controller 1 and the NAND 2 are as stated previously. The phase comparator 16 repeatedly makes the comparison for the DQS signal (DQS IN output) outputted from the NAND 2 based upon the RE signal whose Duty is corrected.

Figure 5A:
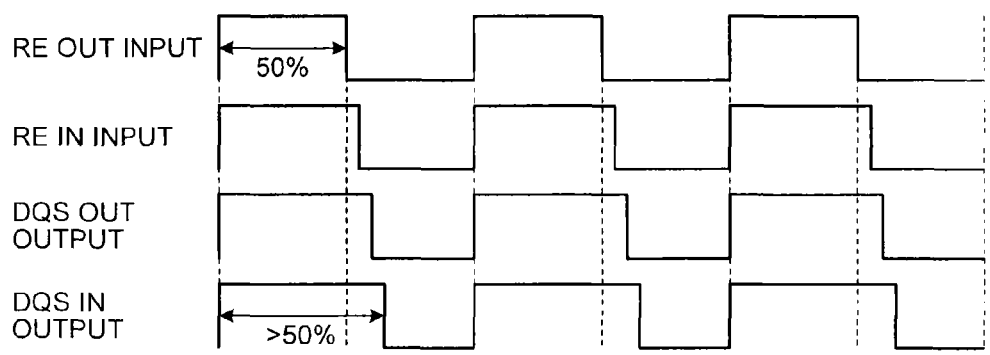
FIG. 5A is a view showing the Duty condition of each signal before the Duty correction in the case where the Duty of the DQS signal is larger than the RE signal.
Figure 5B:
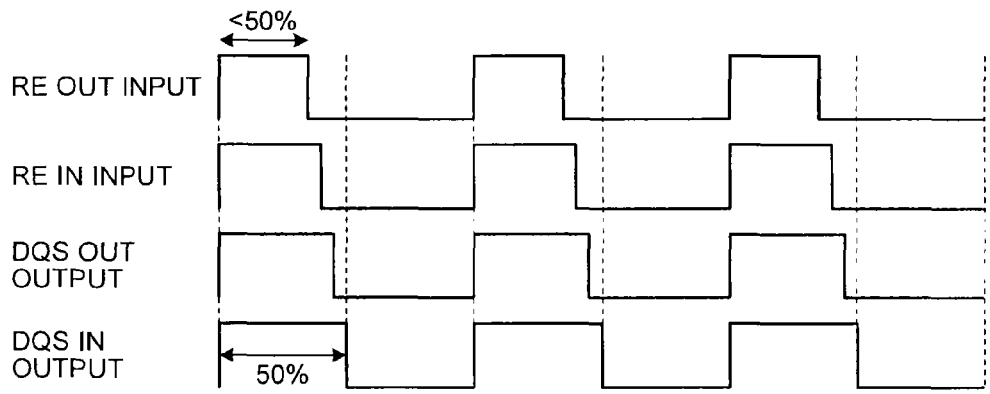
FIG. 5B is a view showing the Duty condition of each signal after the Duty correction in the case where the Duty of the DQS signal is larger than the RE signal.

FIG. 5A is a view illustrating the Duty condition of each signal before the Duty correction in the case where the Duty of the DQS signal is larger than the RE signal. FIG. 5B is a view illustrating the Duty condition of each signal after the Duty correction in the case where the Duty of the DQS signal is larger than the RE signal. When the Duty of the RE OUT input is 50%, the Duty becomes larger in the order of the RE IN input, the DQS OUT output, and the DQS IN output, before the Duty correction. Therefore, the Duty control unit 11 makes correction to decrease the Duty of the RE OUT input to be smaller than 50% in order that the Duty of the DQS IN output becomes 50%, when the Duty becomes larger in the order of the RE IN input, the DQS OUT output, and the DQS IN output. When the Duty of the RE OUT input decreases beforehand in this way, the Duty of 50% of the DQS IN output can be secured after the Duty correction.

As described above, the present embodiment does not assume that the falling phase of the DQS IN output from the input buffer 13 and the rising phase of the delayed DQS IN output from the DLL 15 agree with each other as a result of the comparison by the phase comparator 16. Therefore, even if the Duty of the DQS IN output becomes close to 50%, which means the Duty falls within the required range, the phase comparator 16 outputs the comparison result indicating the phase delay or the phase lead to the Duty control unit 11.

In the present embodiment, the falling phase of the DQS IN output from the input buffer 13 and the rising phase of the delayed DQS IN output from the DLL 15 are compared by the phase comparator 16. However, this is only illustrative, and the falling phase of the delayed DQS IN output from the DLL 15 and the rising phase of the DQS IN output from the input buffer 13 in the next cycle may be compared.

It is assumed that the Duty control unit 11 repeatedly performs the correction of increasing the Duty even when the Duty of the DQS IN output falls within the required range but slightly less than 50% as a result of the comparison in the phase comparator 16, and the correction of decreasing the Duty, even when the Duty of the DQS IN output falls within the required range but slightly exceeds 50% upon the next acquisition of the comparison result from the phase comparator 16. When the Duty control unit 11 alternately performs the correction of increasing the Duty and the correction of decreasing the Duty repeatedly a predetermined number of times, it may determine that the Duty of the DQS IN output shifts around 50%, and may decrease the correction amount of the Duty. With this process, the controller 1 can keep the Duty of the DQS IN output very close to 50%.

According to the first embodiment, in the controller 1, the phase comparator 16 compares the phase of the DQS signal from the NAND 2 and the phase of the delayed DOS signal to which the delay is applied to the DQS signal, and outputs the information indicating the phase delay or the phase lead to the Duty control unit 11. The Duty control unit 11 performs the correction of increasing or decreasing the Duty of the clock signal, which is outputted as the RE signal, based upon the information of the comparison result of the phases from the phase comparator 16. Consequently, the controller 1 can obtain an effect of being capable of keeping the Duty of the DQS signal, inputted from the NAND 2, as 50%.

Second Embodiment

In the first embodiment, the Duty control unit 11 in the controller 1 starts the correction of the Duty upon the start of the storage device. However, the Duty control unit 11 can read the information about the correction content in the previous operation from the NAND 2 upon the start, and can utilize this information.

After the operation is ended, the controller 1 writes the information of the correction content (whether the Duty is increased or decreased for the clock signal from the OSC 10, and how much the correction amount is for increasing or decreasing the Duty) used by the Duty control unit 11 into the NAND 2. Upon the start of the next operation, the controller 1 reads the information about the correction content used in the previous operation from the NAND 2, and the Duty control unit 11 performs the Duty control based upon the information about the read correction content. The writing and reading of the information about the correction content between the controller 1 and the NAND 2 can be made in the same manner as a general writing and reading process. The Duty control unit 11 can acquire the information about the correction content that can be latched by the latch circuit 17 via the control unit 18.

As described in the first embodiment, in the controller 1, the Duty control unit 11 gradually corrects the Duty of the clock signal from the OSC 10 such that the Duty of the DQS IN output becomes 50% based upon the comparison result by the phase comparator 16. On the other hand, in the second embodiment, the Duty control unit 11 is expected to allow the Duty of the DOS TN output to be 50% by decreasing the number of times of the correction by utilizing the information about the previous correction content.

Third Embodiment

In the first embodiment, the Duty control unit 11 in the controller 1 continuously corrects the Duty based upon the comparison result of the phase comparator 16. For example, if the Duty of the DQS IN output is kept around 50%, the Duty control unit 11 does not always update the correction content of the Duty, but may correct the Duty with the same correction content for a certain period. As in the second embodiment, the correction content means whether the Duty is increased or decreased for the clock signal from the OSC 10, and how much the correction amount is for increasing or decreasing the Duty.

For example, the control unit 18 instructs the Duty control unit 11 to update the correction content of the Duty every time a certain period of time elapses based upon an elapsed time of a timer provided to the control unit 18 or an unillustrated timer. When receiving the instruction from the control unit 18, the Duty control unit 11 updates the correction content of the Duty based upon the comparison result from the phase comparator 16. Before receiving the instruction to update the correction content of the Duty from the control unit 18, the Duty control unit 11 continues the correction content, which is updated by the previous instruction from the control unit 18, and performs the correction of the Duty to the clock signal from the OSC 10. During a certain period until the next instruction is issued from the control unit 18, the Duty control unit 11 corrects the Duty to the clock signal from the OSC 10 with the same correction content.

Another method of updating the correction content of the Duty is such that a temperature sensor provided to the controller 18 or an unillustrated temperature sensor monitors the internal temperature of the controller 1, and when a temperature change more than a prescribed temperature occurs, the controller 1 instructs the Duty control unit 11 to update the correction content of the Duty.

Alternatively, a voltage detection unit provided to the controller 18 or an unillustrated voltage detection unit monitors a power supply voltage used in the controller 1, and when a voltage change more than a prescribed voltage occurs, the controller 1 instructs the Duty control unit 11 to update the correction content of the Duty.

Alternatively, the control unit 18 monitors the read condition in the latch circuit 17, and when a read error occurs, the control unit 18 instructs the Duty control unit 11 to update the correction content of the Duty.

As described above, in the third embodiment, the Duty control unit 11 intermittently updates the correction content of the Duty. Accordingly, the controller 1 can reduce power consumption more than the case where the Duty control unit 11 updates the correction content of the Duty every time it acquires the comparison result from the phase comparator 16.

The control unit 18 can intermittently update the correction content of the Duty by the Duty control unit 11 by controlling the changeover of the delay amount to the DLL 15 as another method.

As described in the first embodiment, the DLL 15 changes the delay amount between the case where the DLL 15 outputs the DQS signal to the phase comparator 16 and the case where the DLL 15 outputs the DQS signal to the latch circuit 17 under the instruction from the control unit 18. When receiving an instruction of the delay of 180° from the control unit 18, the DLL 15 applies the delay of 180° to the DQS signal, and outputs the DQS signal with the delay of 180° to the phase comparator 16. Thereafter, the phase comparator 16 compares the DQS signal from the input buffer 13 and the delayed DQS signal from the DLL 15.

In this case, the control unit 18 does not issue the instruction to the Duty control unit 11 on the timing of updating the correction content of the Duty to the Duty control unit 11 described above, but issues the instruction of the delay of 180° to the DLL 15. The frequency of the instruction of the delay of 180° to the DLL, 15 from the control unit 18 is less than that in the first embodiment.

The DLL 15 applies the delay of 180° to the DQS signal on the timing of the instruction from the control unit 18, and outputs the delayed DQS signal with the delay of 180° to the phase comparator 16. The phase comparator 16 cannot compare the phases of two DQS signals until the delayed DQS signal with the delay of 180° is inputted from the DLL 15. As a result, the phase comparator 16 compares the phases on the timing when the DQS signal with the delay of 180° is inputted from the DLL 15, and outputs the comparison result to the Duty control unit 11. The Duty control unit 11 updates the correction content of the Duty on the timing when the information about the comparison result from the phase comparator 16 is inputted. As described above, the Duty control unit 11 updates the correction content of the Duty on the timing of issuing the instruction of the delay of 180° to the DLL 15 from the control unit 18, i.e., on the timing of updating the correction content of the Duty to the Duty control unit 11.

In the controller 1, the control unit 18 instructs the timing of updating the correction content of the Duty to the DLL 15, not to the Duty control unit 11, whereby the power consumption corresponding to the process of the instruction of the delay of 180° to the DLL 15 by the control unit 18, the process of the delay on the DLL 15, and the process of the phase comparison on the phase comparator 16 can be reduced. Accordingly, the power consumption can be reduced more than the case where the instruction is issued to the Duty control unit 11 as described above.

The application to the first embodiment has been described above, but this is only illustrative. The present embodiment is applicable to the second embodiment.

Fourth Embodiment

In the first embodiment, the RE signal and the DQS signal between the controller 1 and the NAND 2 are a single signal line (single-ended signal). However, a differential signal can be used for these signals.

Figure 6:
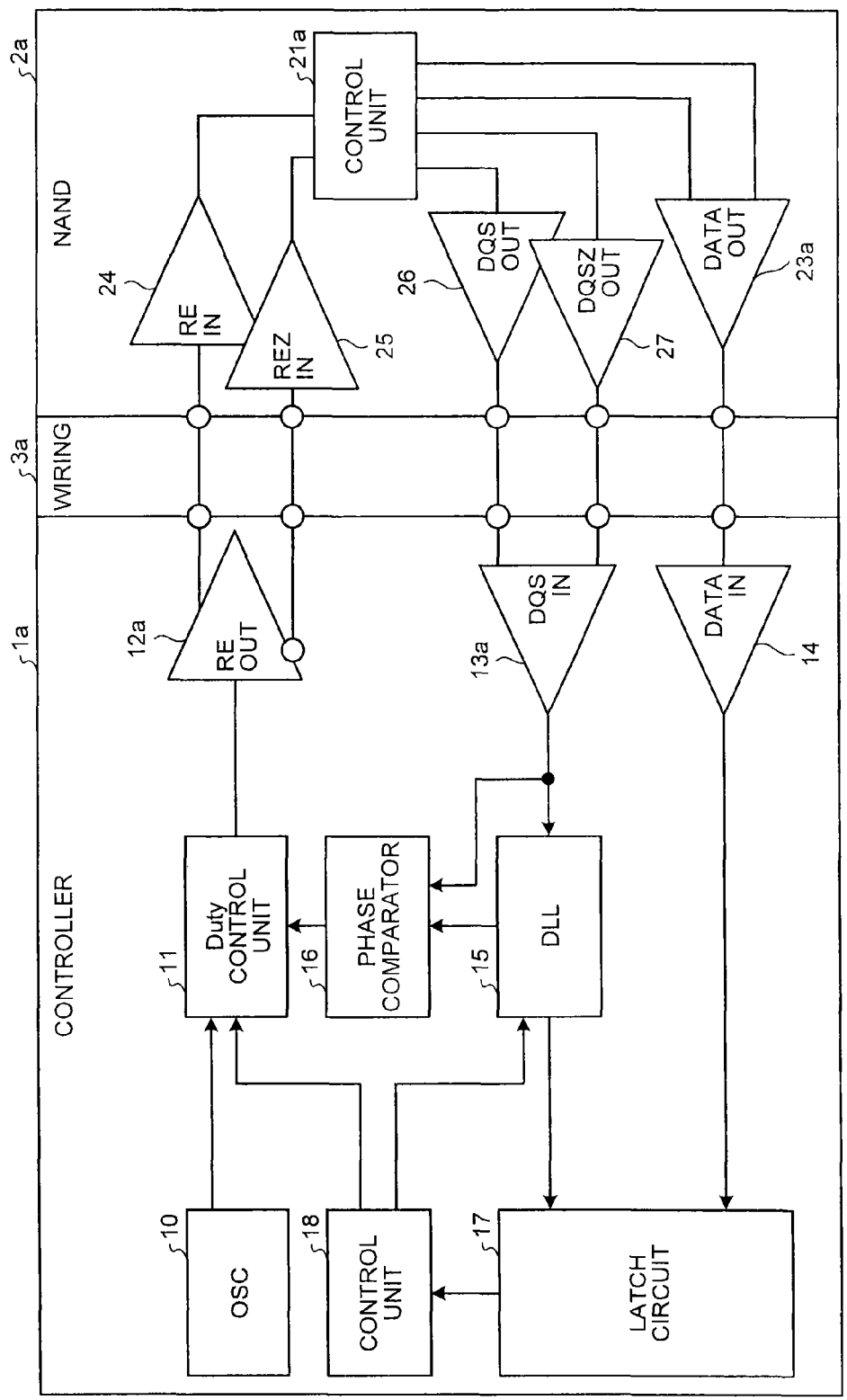
FIG. 6 is a diagram showing one example of a configuration of a storage device including a controller according to a fourth embodiment.

FIG. 6 is a diagram illustrating one example of a configuration of a storage device including a controller according to the present embodiment. The storage device includes a controller 1a, NAND 2a, and a wiring 3a.

The controller 1a is different from the first embodiment in that the controller 1a includes, instead of the output buffer 12, an output buffer 12a that outputs the clock signal from the Duty control unit 11 as the RE signal and an REZ signal to the NAND 2 in the form of a differential signal, and instead of the input buffer 13, an input buffer 13a that receives the DQS signal and a DQSZ signal in the form of the differential signal from the NAND 2. The other configurations and operation are the same as those in the first embodiment.

The NAND 2a includes an input buffer 24 that receives the RE signal from the controller 1a, an input buffer 25 that receives the REZ signal from the controller 1a, a control unit 21a that reads data from an unillustrated memory area based upon the RE signal from the input buffer 24 and the REZ signal from the input buffer 25, and outputs the DATA signal that is the read data, and the DQS signal and DQSZ signal that are in synchronism with the DATA signal, an output buffer 26 that outputs the DQS signal inputted from the control unit 21a to the controller 1a, an output buffer 27 that outputs the DQSZ signal inputted from the control unit 21a to the controller 1a, and an output buffer 23a that outputs the DATA signal inputted from the control unit 21a to the controller 1a.

The wiring 3a includes wirings for the added buffers in order to enable the communication between the controller 1a and the NAND 2a by using the differential signal.

Even when the signal is transmitted and received between the controller 1a and the NAND 2a by using the differential signal, the Duty of the DQS IN output might be increased or decreased with respect to the Duty of the RE OUT input in the controller 1a as in the first embodiment.

Therefore, even when the differential signal is used between the controller 1a and the NAND 2a, the Duty control unit 11 corrects the Duty to the RE OUT input as in the first embodiment, whereby the Duty of the DQS IN output can be kept as 50%.

The application to the first embodiment has been described above, but this is only illustrative. The present embodiment is applicable to the second and third embodiments.

Fifth Embodiment

In the first embodiment, the phase comparator 16 compares the phase of the DQS signal before the delay and the phase of the delayed DQS signal. In the present embodiment, a TDC (Time to Digital Converter) is used as the phase comparator.

FIG. 7 is a diagram illustrating an example of a configuration of a storage device including a controller according to the present embodiment. The storage device includes a controller 1b, NAND 2, and a wiring 3.

The controller 1b is different from the first embodiment in that the controller 1b includes, instead of the Duty control unit 11, a Duty control unit 11b that corrects the Duty of the clock signal inputted from the OSC 10 based upon the information from the TDC 19, and instead of the phase comparator 16, the TDC 19 that receives the DQS signal from the input buffer 13 and the delayed DQS signal from the DLL 15, and outputs the information about the phase difference obtained by the comparison of the phases of two signals to the Duty control unit 11b as information about time. The other configurations and operation are the same as those in the first embodiment.

In the first embodiment, the information indicating the phase delay or the phase lead of the delayed DQS signal can be acquired as a result of the comparison between the phases of two DQS signals by the phase comparator 16. However, the information about the phase difference, such as how much the phase delay is or how much the phase lead is, cannot be acquired.

The TDC 19 used in the present embodiment can output the phase difference as "time" that can represent magnitude. The Duty control unit 11b can determine the correction amount of the Duty based upon the information from the TDC 19. Thus, the controller 1b can enhance the accuracy in one Duty correction by the Duty control unit 11b. According to the fifth embodiment, the number of times of the correction in the Duty control unit 11b until the Duty of the DQS IN output becomes 50% in the controller 1 can be reduced more than the first embodiment.

The application to the first embodiment has been described above, but this is only illustrative. The present embodiment is applicable to the second to fourth embodiments.

In the first to fifth embodiments, the Duty of the DQS IN output in the controller is made 50%. However, the Duty of the DQS IN output may be controlled to be any value other than 50%.

For example, in the first to fourth embodiments, the DLL 15 sets the delay amount to the delayed DQS signal outputted to the phase comparator 16 as 170° or 190°, not 180°. The reason why the delay of 180° is applied by the DLL 15 is to make the Duty of the DOS IN output 50% (=180°/360°). Therefore, when the delay other than the delay of 180° is applied by the DLL 15, and the Duty correction is executed as described above in the controller 1 or in the controller 1a, the Duty of the DQS IN output can be controlled to be any value other than 50%.

In the fifth embodiment, the Duty of the DQS IN output can be controlled to be any value other than 50% by a correction of the Duty of the RE OUT input by the Duty control unit 11b in which the phase difference is not 0, but keeps a predetermined range, based upon the information about the phase difference from the TDC 19.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A controller comprising:
a phase comparator that receives a data strobe signal outputted from a memory in response to a read enable signal, and a delayed data strobe signal formed by applying a delay to the data strobe signal, compares a phase of the data strobe signal and a phase of the delayed data strobe signal, and outputs a comparison result; and
a Duty control unit that corrects a Duty of the read enable signal outputted to the memory based upon the comparison result from the phase comparator.

2. The controller according to claim 1, wherein
the phase comparator outputs the result of the comparison between a falling phase of the data strobe signal and a rising phase of the delayed data strobe signal that is delayed by 180° to the Duty control unit.

3. The controller according to claim 2, wherein
the Duty control unit performs a correction to increase the Duty of the read enable signal to be larger than a current Duty, when acquiring the result of comparison, which indicates that the rising phase of the delayed data strobe signal is delayed, from the phase comparator.

4. The controller according to claim 2, wherein
the Duty control unit performs a correction to decrease the Duty of the read enable signal to be smaller than a current Duty, when acquiring the result of comparison, which indicates that the rising phase of the delayed data strobe signal advances, from the phase comparator.

5. The controller according to claim 2, wherein
the Duty control unit decreases the correction amount of the Duty, when alternately performing the correction of increasing the Duty of the read enable signal and the correction of decreasing the Duty of the read enable signal repeatedly a predetermined number of times.

6. The controller according to claim 1, wherein
the Duty control unit corrects the Duty of the read enable signal by using information of a correction content of the Duty that is written on the memory upon the completion of the previous operation and is read from the memory upon the next start.

7. The controller according to claim 1, further comprising:
a control unit that instructs the Duty control unit to update the correction content of the Duty, wherein
the Duty control unit updates the correction content of the Duty to the read enable signal when receiving the instruction from the control unit.

8. The controller according to claim 7, wherein
the control unit instructs the Duty control unit to update the correction content of the Duty every time a certain period of time elapses.

9. The controller according to claim 7, wherein
the control unit monitors a temperature, and when a temperature change more than a prescribed temperature occurs, the control unit instructs the Duty control unit to update the correction content.

10. The controller according to claim 7, wherein
the control unit monitors a power supply voltage, and when a voltage change more than a prescribed voltage occurs, the control unit instructs the Duty control unit to update the correction content.

11. The controller according to claim 7, wherein
the control unit monitors a read condition of the data, and when a read error occurs, the control unit instructs the Duty control unit to update the correction content.

12. The controller according to claim 1, further comprising:
a delay unit that applies a delay to the data strobe signal, and outputs the delayed data strobe signal to the phase comparator; and
a control unit that instructs a timing of applying the delay to the data strobe signal to the delay unit, wherein
the delay unit applies the delay to the data strobe signal, and outputs the delayed data strobe signal to the phase comparator, when receiving the instruction from the control unit, and
the phase comparator compares the phase of the data strobe signal and the phase of the delayed data strobe signal, and outputs the comparison result to the Duty control unit, when receiving the delayed data strobe signal from the delay unit.

13. The controller according to claim 12,
the control unit issues an instruction of a timing of applying the delay to the delay unit, every time a certain period of time elapses.

14. The controller according to claim 12, wherein
the control unit monitors a temperature, and when a temperature change more than a prescribed temperature occurs, the control unit instructs a timing of applying the delay to the delay unit.

15. The controller according to claim 12, wherein
the control unit monitors a power supply voltage, and when a voltage change more than a prescribed voltage occurs, the control unit instructs a timing of applying the delay to the delay unit.

16. The controller according to claim 12, wherein
the control unit monitors a read condition of the data, and when a read error occurs, the control unit instructs a timing of applying the delay to the delay unit.

17. The controller according to claim 1, wherein
the read enable signal outputted to the memory and the data strobe signal inputted from the memory are single-ended signals or differential signals.

18. The controller according to claim 1, further comprising:
a delay unit that applies a delay to the data strobe signal, and outputs the delayed data strobe signal to the phase comparator, and
a control unit that instructs a delay amount to the delay unit, wherein
the delay unit applies the delay amount instructed from the control unit to the data strobe signal, and outputs the delayed data strobe signal to the phase comparator.

19. The controller according to claim 1, wherein
the phase comparator outputs information about a phase difference to the Duty control unit as the result of the comparison between a falling phase of the data strobe signal and a rising phase of the delayed data strobe signal that is delayed by 180°, and
the Duty control unit determines the correction amount of the Duty of the read enable signal based upon the phase difference that is the comparison result from the phase comparator.

20. The controller according to claim 1, wherein
the Duty control unit corrects the Duty of the read enable
signal in order that the phase difference that is the information acquired from the phase comparator keeps a predetermined range.

\* \* \* \* \*